US012470191B2

(12) United States Patent
Cuesta Cano et al.

(10) Patent No.: US 12,470,191 B2
(45) Date of Patent: Nov. 11, 2025

(54) ELECTROMAGNETIC FILTER FOR OPERATING IN COMMON AND DIFFERENTIAL MODE

(71) Applicant: PREMO, S.L., Campanillas (ES)

(72) Inventors: Juan Miguel Cuesta Cano, Málaga (ES); Paula Pérez Camero, Vélez-Málaga (ES); Antonio Rojas Cuevas, Málaga (ES); Claudio Cañete Cabeza, Benalmádena (ES); Francisco Ezequiel Navarro Pérez, Barcelona (ES)

(73) Assignee: PREMO, S.L., Campanillas (ES)

( * ) Notice: Subject to any disclaimer, the term of this patent is extended or adjusted under 35 U.S.C. 154(b) by 160 days.

(21) Appl. No.: 18/545,116

(22) Filed: Dec. 19, 2023

(65) Prior Publication Data

US 2024/0213945 A1 Jun. 27, 2024

(30) Foreign Application Priority Data

Dec. 21, 2022 (EP) .................................... 22383252

(51) Int. Cl.
*H03H 7/01* (2006.01)
*H01F 27/08* (2006.01)
(Continued)

(52) U.S. Cl.
CPC ........... *H03H 7/0115* (2013.01); *H01F 27/08* (2013.01); *H01F 27/24* (2013.01); *H01F 27/306* (2013.01)

(58) Field of Classification Search
CPC .... H01F 27/2895; H01F 27/306; H01F 27/24; H01F 27/40; H01F 27/38; H01F 17/062;
(Continued)

(56) References Cited

U.S. PATENT DOCUMENTS

| | | | | |
|---|---|---|---|---|
| 3,872,399 | A | 3/1975 | Friberg et al. | |
| 8,351,167 | B2 * | 1/2013 | Wolfus | H01F 29/14 361/19 |

(Continued)

FOREIGN PATENT DOCUMENTS

| | | | |
|---|---|---|---|
| CN | 103545085 | A | 1/2014 |
| EP | 3428937 | A1 | 1/2019 |
| EP | 3493228 | B1 | 5/2020 |

OTHER PUBLICATIONS

EPO, Extended European Search Report for the corresponding European Patent Application No. 22383252.8, dated Jun. 15, 2023, 9 pages.

*Primary Examiner* — Quan Tra
(74) *Attorney, Agent, or Firm* — LUCAS & MERCANTI, LLP

(57) ABSTRACT

An electromagnetic filter for operating in common and differential mode having a toroidal-like magnetic core; first and second separated coils wound around the magnetic core, the first and second coils and the magnetic core configured to provide a common mode filter. The filter also has a third coil that surrounds the magnetic core and the first and second coils and arranged around a Z axis that is coaxial with an inner hollow part of the magnetic core, the third coil being configured to provide a filter operating in differential mode. Two sheets are also arranged between opposite external faces of a capacitor to thermally isolate the capacitor from the coils, the capacitor and sheets being arranged inside the inner hollow part. A layer of a thermal conductive magnetic compound encloses all the elements to increase leakage inductance and to enclose a magnetic field generated by the third coil.

7 Claims, 4 Drawing Sheets

(51) Int. Cl.
*H01F 27/24* (2006.01)
*H01F 27/30* (2006.01)

(58) Field of Classification Search
CPC .. H01F 27/022; H01F 27/08; H01F 2017/048; H01F 2017/0093; H01F 27/22; H03H 7/0115
See application file for complete search history.

(56) References Cited

U.S. PATENT DOCUMENTS

| | | | | |
|---|---|---|---|---|
| 2007/0257759 | A1 | 11/2007 | Lee et al. | |
| 2008/0055035 | A1 | 3/2008 | Gerhard | |
| 2014/0152413 | A1* | 6/2014 | Fu | H01F 27/38 336/192 |
| 2015/0248962 | A1* | 9/2015 | Hodge | H01F 29/14 336/221 |
| 2016/0020745 | A1* | 1/2016 | Joo | H03H 7/38 333/168 |
| 2018/0262751 | A1* | 9/2018 | Fattal | H04N 13/32 |
| 2020/0253002 | A1* | 8/2020 | Viroli | H01F 27/24 |

* cited by examiner

ELECTROMAGNETIC FILTER FOR OPERATING IN COMMON AND DIFFERENTIAL MODE

CROSS-REFERENCE TO RELATED APPLICATION

This application claims priority of European Patent Application No. 22383252.8, filed Dec. 21, 2022, the content of which is incorporated herein by reference.

TECHNICAL FIELD

The proposed invention is related to the field of electromagnetic noise passive filters or EMC filters to reduce electromagnetic interferences or EMI/RFI. More in particular, the invention relates to an electromagnetic filter for operating in both common and differential mode, which is characterized by its particular structure that provides a set of high compactness.

BACKGROUND OF THE INVENTION

An EMC filter is known by Chinese patent application CN103545085A. In said document a double-magnetic-core difference-common mode integrated EMC filter is disclosed. The filter comprises two identical magnetic cores and four coils; the magnetic core is a closed magnetic core; an air gap is reserved between the two magnetic cores; the two common-mode inductance coils are wound on the two magnetic cores in a sharing mode, the two differential-mode inductance coils are wound on the two magnetic cores respectively, and the homonymous terminal of the first differential-mode inductance coil is connected with the homonymous terminal of the first common-mode inductance coil; the homonymous terminal of the second differential-mode inductance coil is connected with the heteronymous terminal of the second common-mode inductance coil.

In another possible embodiment, the EP3493228B1 discloses an annular magnetic power unit comprising: a first partial magnetic core and a second partial magnetic core overlapped and facing to each other, said first partial magnetic core having a first annular groove accessible through a surface of the first partial magnetic core; at least one electro-conductive inner coil included within the annular groove; and at least one electro-conductive outer coil wound around the annular magnetic core. The at least one electro-conductive outer coil is formed by two independent electro-conductive outer coils named left and right independent electro-conductive outer coils and the first partial magnetic core is divided by two parallel air-gaps in three independent parts corresponding to a first central magnetic core portion, defined between said two parallel air-gaps, to a first left-side core portion and to a first right-side core portion placed on both sides of said first central magnetic core portion. The second partial magnetic core is also divided by said two parallel air-gaps in three independent parts corresponding to a second central magnetic core portion, defined between said two parallel air-gaps.

DESCRIPTION OF THE INVENTION

An object of the present invention is to provide an electromagnetic filter to operate in both common and differential mode and which increases leakage inductance and improves thermal link to a customer cooling plate.

To that end, the proposed filter of the invention comprises a toroidal-like magnetic core and first and second separated coils that are wound around the toroidal-like magnetic core, the first and second separated coils and the toroidal-like magnetic core being configured to provide a common mode filter.

According to this invention, the first and second separated coils are arranged in opposition to each other and around two major separated segments of the toroidal-like magnetic core.

Moreover, the electromagnetic filter further comprises: a third coil that is arranged to surround the toroidal-like magnetic core and the first and second separated coils and arranged around a Z axis that is coaxial with an inner hollow part of the toroidal-like magnetic core, the third coil being configured to provide a filter operating in differential mode; a capacitor; two sheets arranged between opposite external faces of the capacitor to thermally isolate the capacitor from the first and second separated coils; the capacitor and the two sheets being arranged inside the inner hollow part of the toroidal-like magnetic core; and a layer of a thermal conductive magnetic compound configured to enclose/encapsulate the toroidal-like magnetic core, the first, second and third coils, the capacitor, and the two sheets to: increase leakage inductance, to enclose/encapsulate the magnetic field generated by the third coil, and also to provide good thermal link to the customer cooling plate.

According to the invention, the toroidal-like magnetic core can be oval and elongated, or elliptic.

In some embodiments, the material of the two sheets is made of a polystyrene material or similar.

In some embodiments, the toroidal-like magnetic core is a nanocrystalline structure core.

The proposed filter improves differential mode attenuation. In some embodiments, compared to the classical solutions, said attenuation can be more than 20 dB @100 k-1 MHz. The proposed filter also provides good mechanical interfaces and thermal link with customer housing and cooling system.

BRIEF DESCRIPTION OF THE FIGURES

The foregoing and other advantages and features will be more fully understood from the following detailed description of an embodiment with reference to the accompanying drawings, to be taken in an illustrative and non-limitative manner, in which.

DETAILED DESCRIPTION OF THE INVENTION AND OF PARTICULAR EMBODIMENTS

Figure 1A:
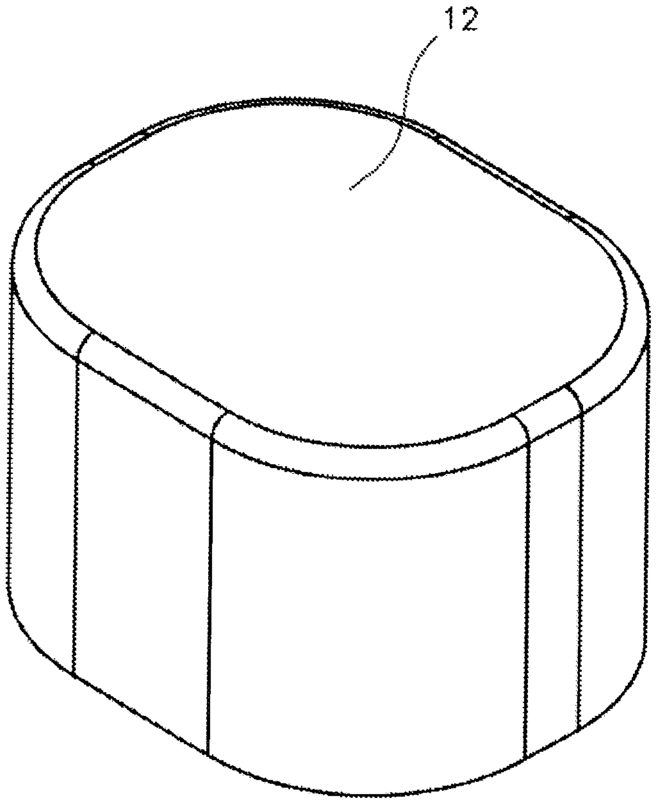
FIGS. 1A and 1B illustrate an electromagnetic filter for operating in common and differential mode, according to an embodiment of the present invention.
Figure 1B:
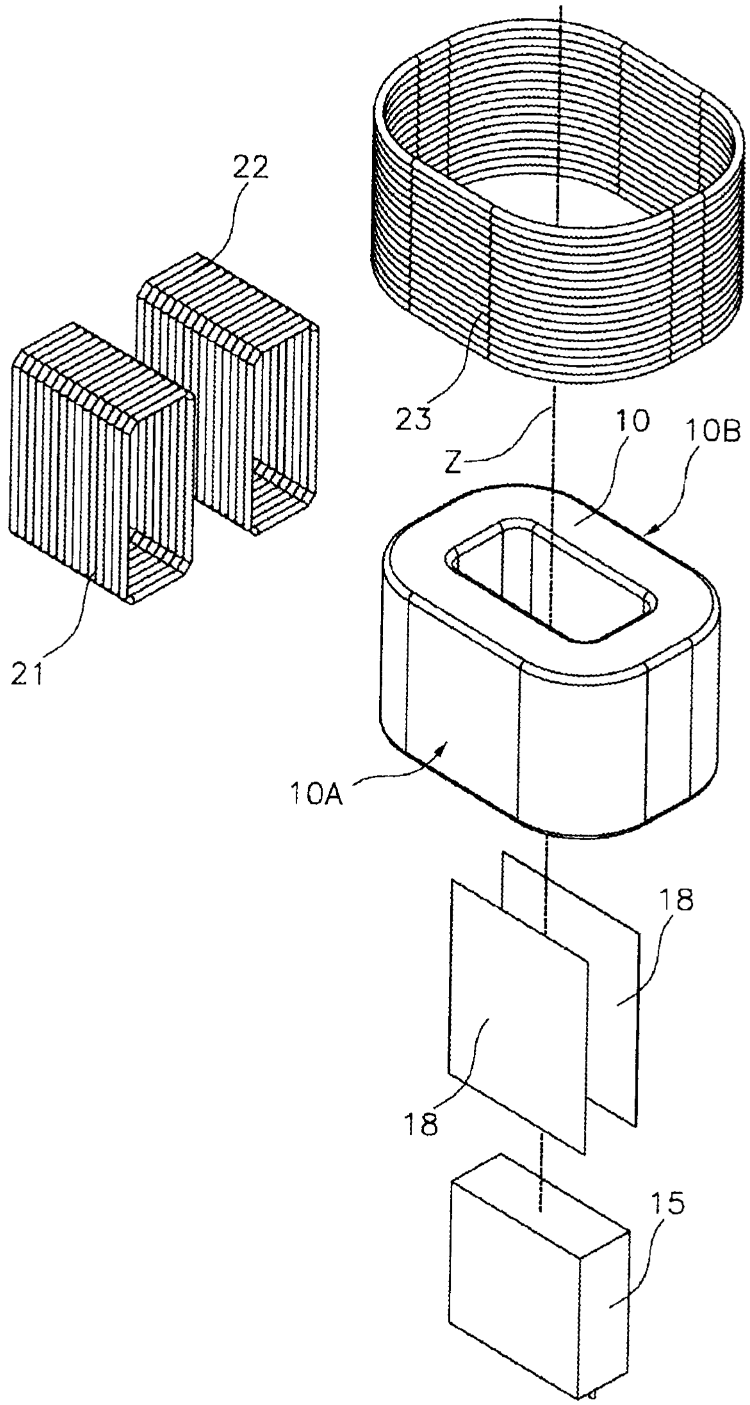
Figure 1C:
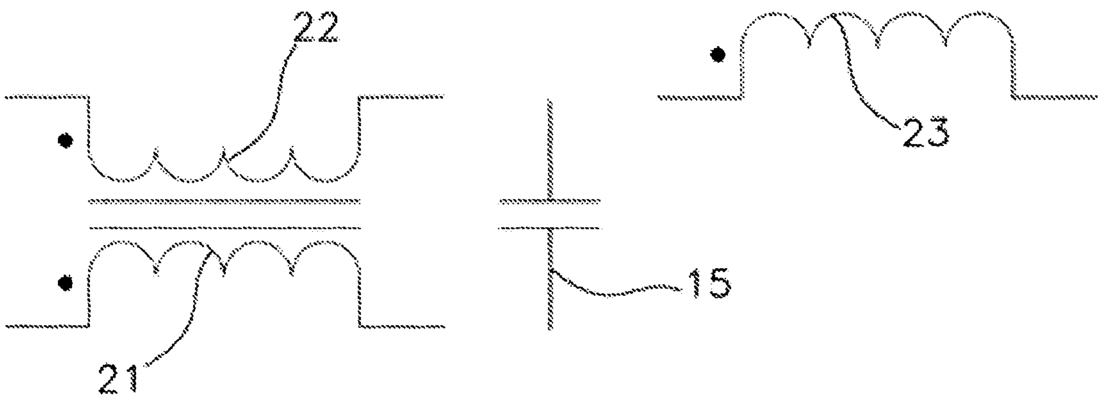
FIG. 1C is a schematic diagram of the proposed filter with the capacitor and coils.

FIGS. 1A and 1B and 2A and 2B show an embodiment of the proposed electromagnetic filter. As seen in the figures, the electromagnetic filter comprises a nanocrystalline toroidal-like magnetic core 10, a first 21 coil, a second 22 coil, a third coil 23, a capacitor 15 and two sheets 18, which are preferably made of a polystyrene material.

As seen in FIG. 1A, all the cited elements/components of the electromagnetic filter, once assembled/gathered, are enclosed/encapsulated by a layer of a thermal conductive magnetic compound 12. Because of this enclosure, leakage inductance is enhanced, and the magnetic field generated by the third 23 coil can be enclosed. It also provides good thermal link to the customer cooling plate.

Particularly, the first and second coils 21, 22 and the toroidal-like magnetic core 10 are configured to operate as a common mode filter. The third 23 coil and the capacitor 15 is configured to operate as a differential mode filter. Therefore, the electromagnetic filter can operate in both modes (i.e., dual mode).

Figure 2A:
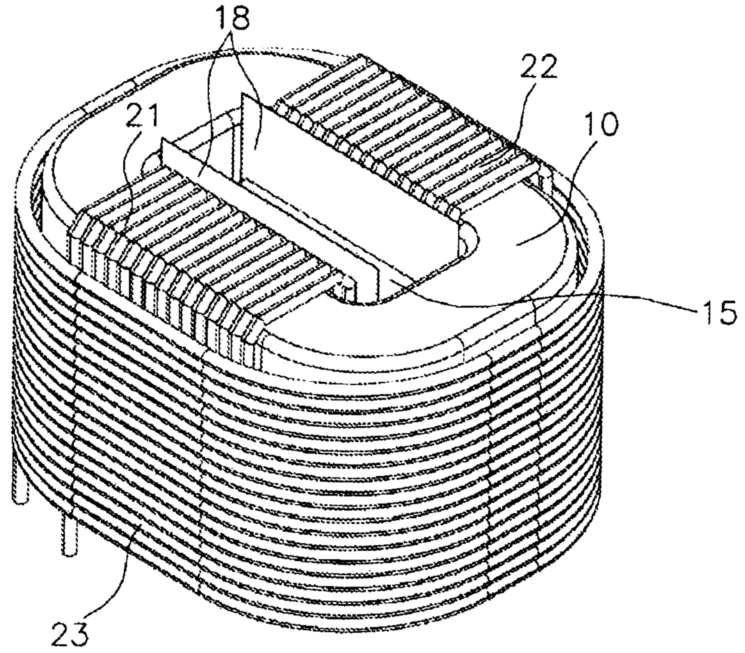
FIGS. 2A and 2B are different views of the electromagnetic filter with all the components/elements thereof assembled. The spatial position of each component/element that forms the compact electromagnetic filter of the invention can be appreciated. The electrical connections of each electronic component can also be seen in detail.
Figure 2B:
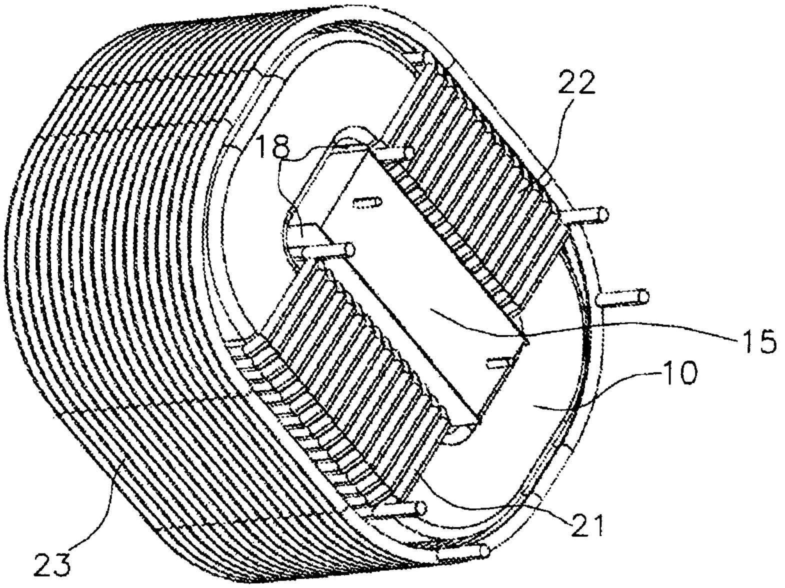

The first 21 and second 22 coils are separated between them and arranged in opposition to each other. Likewise, the two coils 21, 22, when assembled (as can be seen in FIGS. 2A and 2B), are arranged around two major separated segments 10A, 10B of the toroidal-like magnetic core 10.

The third 23 coil is arranged to surround the toroidal-like magnetic core 10, the first 21 coil, and the second 22 coil around a Z axis that is coaxial with an inner hollow part of the toroidal-like magnetic core 10.

The capacitor 15, when assembled, is sandwiched by the two sheets 18. Moreover, the capacitor 15 and the two sheets 18 are arranged inside the inner hollow part of the toroidal-like magnetic core 10. The two sheets 18 allow thermally isolating the capacitor 15 from the first and second coils 21, 22.

The first, second and third coils 21, 22 and 23 are thermally isolated between them and the capacitor 15 to ensure safety operation. The first, second and third coils 21, 22 and 23 are also electrically isolated.

It should be noted that in other embodiments, not illustrated, the proposed electromagnetic filter can include more than one capacitor.

The following table summarizes some of the characteristics the electromagnetic filter may have. In a particular embodiment, the electromagnetic filter is designed to operate according to the AEC-Q200 standard being such characteristics as follows:

| | |
|---|---|
| Rated current | 16Arms |
| Rated voltage | 630 Vdc |
| MAX Dimensions | 55 × 45 × 35 mm |
| CMC Inductance | 21 mH @10 kHz |
| CMC Inductance | 5 mH@100 kHz |
| CMC LIkg | >30 uH @100 kHz |
| CMC DCR | <10 mΩ |
| DM Inductance | 32 uH@10 kHz |
| Cx capacitor | 1.0 uF |
| Withstand voltage | 2000 Vac 50 Hz 60 s |
| Operating ambient temperature | −40° C. to +105° C. |

The scope of the present invention is defined in the following set of claims.

The invention claimed is:

1. An electromagnetic filter configured to operate in common and differential mode, comprising:
- a toroidal-like magnetic core;
- first and second separated coils wound around the toroidal-like magnetic core and arranged around a Z axis that is coaxial with an inner hollow part of the toroidal-like magnetic core, the first and second separated coils and the toroidal-like magnetic core being configured to provide a common mode filter, the first and second separated coils are arranged in opposition to each other and around two major separated segments of the toroidal-like magnetic core;
- a third coil that is arranged to surround the toroidal-like magnetic core, the third coil being configured to provide a filter operating in differential mode;
- at least one capacitor;
- two sheets arranged between opposite external faces of the capacitor to thermally isolate the capacitor from the first and second separated coils;
- the capacitor and the two sheets being arranged inside the inner hollow part of the toroidal-like magnetic core; and
- a layer of a thermal conductive magnetic compound configured to enclose the toroidal-like magnetic core, the first, second and third coils, the capacitor and the two sheets, such that leakage inductance is increased, a magnetic field generated by the third coil is enclosed, and a good thermal link to a cooling plate is provided.

2. The electromagnetic filter according to claim 1, wherein the toroidal-like magnetic core is oval and elongated.

3. The electromagnetic filter according to claim 1, wherein the toroidal-like magnetic core is elliptical.

4. The electromagnetic filter according to claim 1, wherein the third coil is arranged perpendicularly with respect to the first and second separated coils.

5. The electromagnetic filter according to claim 1, wherein the third coil is decoupled with regard to the first and second separated coils.

6. The electromagnetic filter according to claim 1, wherein the two sheets are made of a polystyrene material.

7. The electromagnetic filter according to claim 1, wherein the toroidal-like magnetic core is a nanocrystalline core.

* * * * *